United States Patent [19]

Milgram

[11] 4,428,796

[45] Jan. 31, 1984

[54] ADHESION BOND-BREAKING OF LIFT-OFF REGIONS ON SEMICONDUCTOR STRUCTURES

[75] Inventor: Alvin Milgram, Sunnyvale, Calif.

[73] Assignee: Fairchild Camera and Instrument Corporation, Mountain View, Calif.

[21] Appl. No.: 404,108

[22] Filed: Aug. 2, 1982

[51] Int. Cl.$^3$ .................. B44C 1/22; C03C 15/00; C03C 25/06

[52] U.S. Cl. .................... 156/637; 134/19; 134/22.19; 134/34; 156/652; 156/655; 156/668; 252/79.1; 427/88; 430/314; 430/317

[58] Field of Search ............. 156/637, 643, 646, 652, 156/653, 655, 657, 659.1, 661.1, 668; 430/313, 314, 315, 316, 317; 427/43.1, 88, 91, 96, 99; 204/164, 192 E; 252/79.1; 134/19, 22.19, 34

[56] References Cited

U.S. PATENT DOCUMENTS 3,873,361  3/1975  Franco .................. 430/314 X
4,256,816  3/1981  Dunkleberger ........... 430/314 X Primary Examiner—William A. Powell
Attorney, Agent, or Firm—Kenneth Olsen; Robert C. Colwell; Carl L. Silverman

[57] ABSTRACT

A process is described for removing polyimide regions adhered to the surface of a semiconductor structure 10 which includes the steps of heating the structure 10 and the polyimide regions 12 to between 450° and 490° C., immersing the structure in a solution of one of methylene chloride and ethylene diamine/hydrazine, and ultrasonerating the solution and the semiconductor structure.

7 Claims, 4 Drawing Figures

ADHESION BOND-BREAKING OF LIFT-OFF REGIONS ON SEMICONDUCTOR STRUCTURES

BACKGROUND OF THE INVENTION

1. Field of the Invention

This invention relates to the fabrication of integrated circuit structures, and in particular, to the fabrication of metal conducting lines on the surface of such structures using lift-off techniques, and the subsequent removal of the lift-off materials.

2. Description of the Prior Art

Lift-off techniques for forming desired regions of material on the surface of integrated circuit structures are generally known. A survey of various lift-off processes is presented in "Lift-Off Techniques for Fine-Line Metal Patterning," by J. Frary and P. Seese, *Semiconductor International*, December 1981, pages 70-89.

In conventional integrated circuit fabrication technology, patterns of desired material are formed on the surface of an integrated circuit structure using etching techniques. Such processes suffer from a number of disadvantages which restrict their application, particularly in the fabrication of integrated circuit structures having exceptionally small regions. For example, to insure complete etch removal of deposited material, the pattern must always be at least slightly over-etched, leading to diminished line widths for a particular line spacing. Although this problem may be lessened by using plasma or reactive ion etching, these processes in turn create chemical contamination problems which must also be solved.

The use of lift-off processes circumvents many of these disadvantages. For example, because the integrated circuit structure itself is not subjected to plasma or reactive ion etching, radiation damage to active devices is minimized. Furthermore, lift-off processing is usable over a wide range of temperatures for patterning many materials commonly used in the fabrication of integrated circuits.

Because the lift-off material, typically a polyimide, must be firmly anchored to the underlying integrated circuit to allow accurate patterning of the lift-off material itself, it is often difficult to completely remove the lift-off material from the surface of the circuit at the end of a process sequence. This difficulty is further increased when adhesives are used for attaching the lift-off material to the surface of the circuit, and when the polyimide itself is generally insoluble. Incomplete removal of the lift-off material generally results in lower yields by creating short circuits or obscuring portions of the surface of the integrated circuit structure from subsequent process operations.

SUMMARY OF THE INVENTION

This invention provides a technique by which lift-off material may be firmly adhered to the surface of the integrated circuit structure, yet easily removed at the completion of the lift-off process. In particular, this invention allows the fabrication of fine metal lines across the surface of the semiconductor structure, while simultaneously permitting relatively high temperature processing, and permitting well-controlled removal of the lift-off material.

In one embodiment a process for removing polyimide regions adhered to a semiconductor structure comprises heating the semiconductor structure and the polyimide to between 450° and 490° C. in a nitrogen atmosphere followed by immersing the structure in boiling water. The structure is then immersed in methylene chloride followed by a solution of ethylene diamene and hydrazine, both while ultrasonerating the solution and the semiconductor structure.

DETAILED DESCRIPTION OF THE PREFERRED EMBODIMENTS

Figure 1:
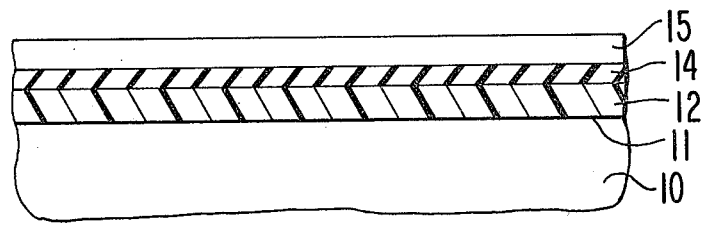
FIG. 1 is a cross-sectional view of an integrated circuit structure before patterning.

FIG. 1 is a cross-sectional view of an integrated circuit structure including a silicon wafer 10, a layer of polyimide 12, a layer of silicon dioxide 14, and a layer of photoresist 15. Substrate or wafer 10 will typically be a partially completed integrated circuit structure which may include active and passive electronic components, layers of electrically conducting material, or other desired regions. As will be evident, the particular characteristics of substrate 10 are not critical to the invention, but simply provide an underlying structure which may be employed in the process of this invention.

In the preferred embodiment substrate 10 comprises a silicon substrate. This substrate is first coated with 5 to 6 nanometers of an adhesion promoter, such as HMDS manufactured by Petrarch Systems or VM-651 manufactured by DuPont. Either of these materials may be applied using a spinning operation, and will function to provide improved adhesion between subsequently deposited layers and the surface 11 of substrate 10. A suitable polyimide material 12 is then deposited to a thickness of 1.5 to 4.0 microns, also using a spinning operation. In the preferred embodiment the polyimide material 12 comprises DuPont product PI-2555, or Ciba Geigy product XU-218-HP. After spinning the polyimide onto the wafer the material is cured in air by heating it slowly to 300° C. and holding it at approximately that temperature for 30 minutes.

Approximately 1300 Angstroms of silicon dioxide 14 are then deposited on the upper surface of polyimide 12 by using either vacuum deposition or plasma assisted chemical vapor deposition. The thickness of silicon dioxide 14 will be determined by the particular plasma etching step described below, however, thicknesses between 0.1 and 0.3 microns have been found suitable.

On the upper surface of silicon dioxide 14 a layer of positive photoresist between 0.5 and 1.0 microns thick is deposited using conventional techniques. The photoresist 15 is then cured by baking it to 90° C. for approximately 6 minutes. In the preferred embodiment photoresist 15 is product AZ-1450J manufactured by Shipley Company, Inc. and is approximately 0.5 microns thick.

Figure 2:
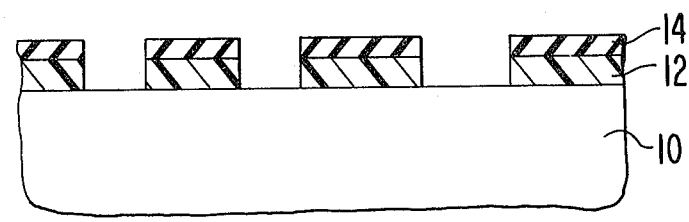
FIG. 2 is a subsequent cross-sectional view after patterning.

The photoresist 15 is then exposed using conventional integrated circuit fabrication equipment, for example, a Mann stepper. The photoresist is developed and hardbaked for 30 minutes at temperature of 135° C. Using well-known plasma or reactive ion etching apparatus, the silicon dioxide 14 is etched away where the photoresist has been removed. In the preferred embodiment this is achieved using carbon tetrafluoride plasma. Oxygen plasma is then used to etch the polyimide, and the structure is dipped in hydrochloric acid for 30 seconds to remove any residue. The appearance of the structure at this stage in the process is depicted in FIG. 2.

Figure 3:
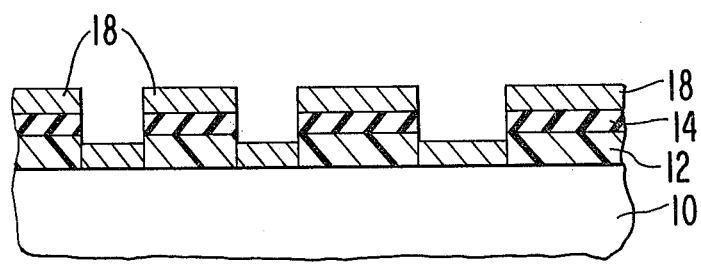
FIG. 3 is a subsequent cross-sectional view after forming desired metal connections.

As shown by FIG. 3 desired material 18 is then deposited across the structure. Typically material 18 will comprise electrically conductive material used to form connections between various regions of the underlying substrate 10. The structure may be at a temperature up to or somewhat higher than 340° C. during the deposition. As shown by FIG. 3 metal 18 will be deposited both on the substrate 10 and on the silicon dioxide 14. The metal may be any desired thickness, however it must be sufficiently thin so as not to form a continuous coating across the surface of the structure, but rather only partially fill the openings as shown. Of course if thicker metal 18 is desired, polyimide 12 may be deposited thicker. Generally, the polyimide 12 will be formed to a thickness of 25% greater than the thickness of the desired metal 18. To form the metal in the manner depicted in FIG. 3, the metal must be deposited approximately normally to the upper surface 11 of wafer 10. In this manner the discontinuities between the various regions of metal 18 on the polyimide 12 and the metal 18 on the substrate 10 are created.

The structure is then heated to a temperature of 450°-490° C. in dry nitrogen for about 1 hour. This heat treatment is for the purpose of breaking the polymer bonds that exist between molecules of the adhesive layer, and also the bonds between the adhesive layer and the polyimide material. It is to be noted that a partial hydrogen content may be used without interfering with the bond-breaking process, and, in addition, will give the hydrogen anneal at 450°-490° C. that is a normal step in subsequent processing of deposited metal contact structures.

Figure 4:
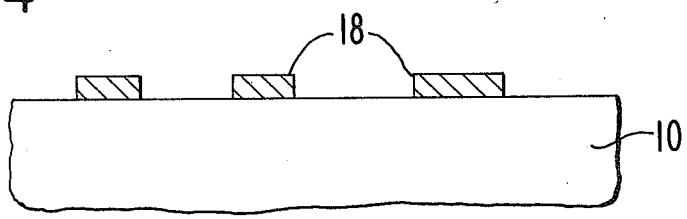
FIG. 4 is a subsequent cross-sectional view after adhesion bond-breaking of the lift-off material.

The lift-off structure comprising polyimide 12, silicon dioxide 14 and the undesired metal 18 deposited on silicon dioxide 14, is then removed. This may be achieved using either of two processes. In a first process the structure is placed in boiling distilled water with a wetting agent for approximately 30 minutes. It is then cleaned ultrasonically in methlyene chloride for 10 minutes. The cycle of boiling and ultrasonic treatment is repeated as many times as necessary to remove the lift-off material. The resulting structure is shown in FIG. 4.

A second technique for removing the lift-off material when HMDS has been used is to place the structure in boiling distilled water and then in a mixture of ethylene diamene and hydrazine (64% water) with a volume ratio of 60/40 at 30° C. The solution may be agitated ultrasonically. Complete delamination of the polyimide is observed in about 30 seconds to 10 minutes, yet metal 18 will remain unattacked for at least 15 minutes. The ethylene diamene is available from Aldrich Company in Milwaukee, Wis., while the hydrazine is available from Matheson Coleman and Bell in Norwood, Oh. If the adhesive agent VM-651 has been used, instead of HMDS, the solution is heated to a temperature of 70° C. and 30 minutes are required for removal of the lift-off material.

The foregoing description is intended to describe the preferred embodiments of the invention. It will be apparent, however, that numerous variations may be made in the process without departing from the scope of the invention as defined in the appended claims.

I claim:

1. A process for removing polyimide regions adhered to semiconductor structures comprising:
   heating the structure and the polyimide regions to between 450° and 490° C.;
   immersing the structure in a solution of one of methylene chloride and ethylene diamene/hydrazine; and
   ultrasonerating the solution and the semiconductor structure.

2. A process as in claim 1 wherein the step of heating comprises heating in dry nitrogen.

3. A process as in claim 2 wherein the step of heating further comprises heating for about one hour.

4. A process as in claim 1 wherein the step of immersing the structure is preceded by a step of boiling the structure in water.

5. A process as in claim 4 wherein the water includes a wetting agent.

6. A process as in claim 1 wherein the ethylene diamene/hydrazine solution comprises about 40 percent hydrazine by volume.

7. A process as in claim 1 wherein the step of heating comprises heating in a gas comprising hydrogen.

* * * * *